United States Patent
Hatta

(10) Patent No.: US 10,958,035 B2
(45) Date of Patent: Mar. 23, 2021

(54) WAVELENGTH-MULTIPLEXED LIGHT TRANSMISSION MODULE AND METHOD FOR MANUFACTURING SAME

(71) Applicant: Mitsubishi Electric Corporation, Tokyo (JP)

(72) Inventor: Tatsuo Hatta, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 18 days.

(21) Appl. No.: 16/473,815

(22) PCT Filed: Nov. 9, 2017

(86) PCT No.: PCT/JP2017/040416
§ 371 (c)(1),
(2) Date: Jun. 26, 2019

(87) PCT Pub. No.: WO2018/168063
PCT Pub. Date: Sep. 20, 2018

(65) Prior Publication Data
US 2020/0321747 A1    Oct. 8, 2020

(30) Foreign Application Priority Data

Mar. 13, 2017  (WO) .................. PCT/JP2017/040416

(51) Int. Cl.
*H01S 5/00*  (2006.01)
*H01S 5/026*  (2006.01)
(Continued)

(52) U.S. Cl.
CPC .......... *H01S 5/0078* (2013.01); *H01S 5/0268* (2013.01); *H01S 5/0651* (2013.01); *H01S 5/18361* (2013.01)

(58) Field of Classification Search
CPC .. H01S 5/0078; H01S 5/18361; H01S 5/0651; H01S 5/0268
(Continued)

(56) References Cited

U.S. PATENT DOCUMENTS 5,583,683 A * 12/1996 Scobey .................. G02B 5/288
398/79
9,746,412 B2 * 8/2017 Chen .................. G01N 15/1436
(Continued)

OTHER PUBLICATIONS

Tadashi Murao, et al., "Integrated Spatial Optical System for Compact 28-Gb/s x 4-lane Transmitter Optical Subassemblies", IEEE Photonics Technology Letters, vol. 26, No. 22, Nov. 15, 2014, pp. 2275-2278.
(Continued)

*Primary Examiner* — Tuan N Nguyen
(74) *Attorney, Agent, or Firm* — Studebaker & Brackett PC

(57) ABSTRACT

A wavelength-multiplexed light transmission module according to the present invention includes a plurality of lasers that respectively emit a plurality of laser beams having different wavelengths, a lens radially emitting the plurality of laser beams, a bandpass filter that has a transmission center wavelength which is shorter as an incident angle is larger, and a mirror for reflecting the plurality of laser beams, wherein the plurality of laser beams are incident to the bandpass filter such that the incident angle of a laser beam is larger as the laser beam has a shorter wavelength, whereby the plurality of laser beams are transmitted through the bandpass filter, and an inclination angle of the mirror with respect to the bandpass filter is provided such that the plurality of laser beams transmitted through the bandpass filter are reflected by the bandpass filter and the mirror to be multiplexed with one another.

14 Claims, 14 Drawing Sheets

(51) Int. Cl.
*H01S 5/065* (2006.01)
*H01S 5/183* (2006.01)

(58) Field of Classification Search
USPC .................................. 359/634, 629; 372/99
See application file for complete search history.

(56) References Cited

U.S. PATENT DOCUMENTS

| | | | | |
|---|---|---|---|---|
| 2009/0257462 | A1* | 10/2009 | Furukawa | H01S 5/4062 |
| | | | | 372/22 |
| 2009/0316746 | A1* | 12/2009 | Nowak | G03F 7/70033 |
| | | | | 372/55 |
| 2011/0274135 | A1* | 11/2011 | Kaertner | G02B 5/0825 |
| | | | | 372/99 |
| 2017/0153458 | A1* | 6/2017 | Mitamura | G02B 6/4286 |
| 2018/0024040 | A1* | 1/2018 | Yan | G01N 15/1436 |
| | | | | 435/288.7 |

OTHER PUBLICATIONS

International Search Report; Written Opinion; and Notification of Transmittal of the International Search Report and the Written Opinion of the International Searching Authority, or the Declaration issued in PCT/JP2017/040416; dated Jan. 23, 2018.

\* cited by examiner

| LANE | OPTICAL FREQUENCY (THz) | CENTER WAVELENGTH (nm) | USE WAVELENGTH RANGE (nm) |
|---|---|---|---|
| L0 | 231.4 | 1295.56 | 1294.53-1296.59 |
| L1 | 230.6 | 1300.05 | 1299.02-1301.09 |
| L2 | 229.8 | 1304.58 | 1303.54-1305.63 |
| L3 | 229.0 | 1309.14 | 1308.09-1310.19 |

FIG.8
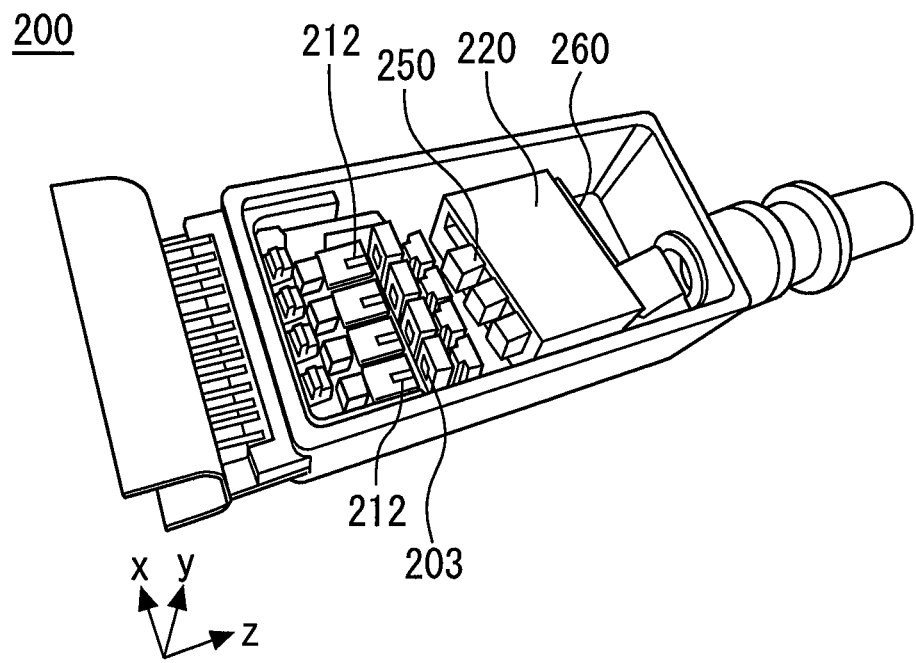
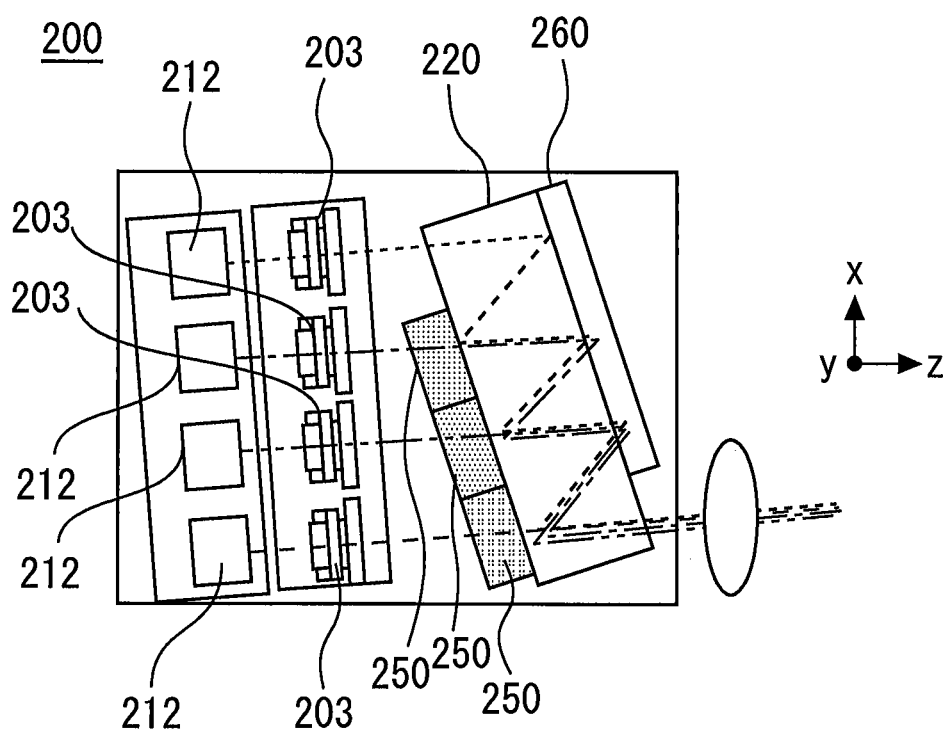

FIG.9

|  | FIRST LASER | SECOND LASER | THIRD LASER | FORTH LASER |
|---|---|---|---|---|
| WAVELENGTH ARRAY OF LAN-WDM STANDARD | 1295.56 | 1300.05 | 1304.58 | 1309.14 |
| TRANSMISSION CENTER WAVELENGTH OF BANDPASS FILTER | 1295.14 | 1300.48 | 1305.02 | 1308.71 |
| OSCILLATION WAVELENGTH OF FIRST EMBODIMENT | 1295.56 | 1300.05 | 1304.58 | 1309.14 |
| OSCILLATION WAVELENGTH OF SECOND EMBODIMENT | 1295.14 | 1300.48 | 1305.02 | 1308.71 |

WAVELENGTH-MULTIPLEXED LIGHT TRANSMISSION MODULE AND METHOD FOR MANUFACTURING SAME

FIELD

The present invention relates to a wavelength-multiplexed light transmission module and a method for manufacturing the same.

BACKGROUND

NPL 1 discloses a wavelength-multiplexed light transmission module including four LDs (Laser Diodes) for emitting laser beams having different wavelengths from one another. This wavelength-multiplexed light transmission module multiplexes and transmits four laser beams. In addition, the wavelength-multiplexed light transmission module includes four collimating lenses, three bandpass filters for transmitting laser beams therethrough, and a total reflection mirror to multiplex the four laser beams having different wavelengths.

CITATION LIST

Non Patent Literature

[NPL 1] IEEE Photonics Technology Letters, Vol. 26, No. 22, Nov. 15, 2014

SUMMARY

Technical Problem

Three-dimensional optical axis adjustment is generally performed on a collimating lens. Furthermore, the collimating lens is generally fixed with high reliability so as not to cause axial misalignment after the optical axis adjustment. Since the wavelength-multiplexed light transmission module shown in NPL 1 has four collimating lenses, it may take time and labor to perform the optical axis adjustment and the fixation.

In addition, the bandpass filters and the total reflection mirror may also have three-dimensional degrees of freedom for the optical axis adjustment. In this case, it is generally difficult in the wavelength-multiplexed light transmission module shown in the NPL 1 that the three bandpass filters and the total reflection mirror are fixed so as not to cause a misalignment. For this reason, the manufacturing cost may increase, and thus mass productivity may be impaired.

Furthermore, since the wavelength-multiplexed light transmission module shown in the NPL 1 includes plural collimating lenses and plural bandpass filters, so that the structure may be complicated in some cases. Here, a metal holder such as a lens holder may be welded and fixed by YAG (Yttrium Aluminum Garnet) welding or the like. At this time, since the structure is complicated, it may be difficult to repeat additional laser radiation and perform adjustment after a plurality of metal holders are welded. Furthermore, use of an adhesive agent is also conceivable as another fixing method of the collimating lenses. In this case, it may be difficult to suppress hardening shrinkage of the adhesive agent and a time-dependent change in shape after hardening in the plural collimating lenses. Therefore, the manufacturing time is considered to lengthen. Furthermore, the yield may be affected.

Furthermore, in the wavelength-multiplexed light transmission module shown in the NPL 1, each collimated light is independently configured by each collimating lens and each LD. Therefore, the collimated light is restricted by the size of the collimating lens, and it may be difficult to reduce the interval of the collimated lights to 1 mm or less. At this time, the interval between laser emitting waveguides of the LDs is also equal to 1 mm or more, so that the chip size may become large. Therefore, the manufacturing cost may increase. Furthermore, it may be difficult to monolithically integrate the plural LDs.

In general, it is necessary that the bandpass filters and the total reflection mirror are held by a holder with a degree of parallelization of 0.05° or less. Therefore, in the wavelength-multiplexed light transmission module shown in the NPL 1, it is necessary to process surfaces of the holder holding the bandpass filters and the total reflection mirror with high accuracy. Consequently, mass productivity may decrease and the processing cost may increase.

The present invention has been made to solve the above problems, and has an object to obtain a wavelength-multiplexed light transmission module which can be miniaturized, and a method for manufacturing the same.

Solution to Problem

A wavelength-multiplexed light transmission module according to the present invention includes a plurality of lasers that respectively emit a plurality of laser beams having different wavelengths from one another, a lens to which the plurality of laser beams are incident, the lens radially emitting the plurality of laser beams, a bandpass filter that is provided in a light emitting direction of the lens and has a transmission center wavelength which is shorter as an incident angle is larger, and a mirror that is provided to be inclined with respect to the bandpass filter in a light emitting direction of the bandpass filter and has a reflecting surface for reflecting the plurality of laser beams, wherein the plurality of laser beams are incident to the bandpass filter such that the incident angle of a laser beam is larger as the laser beam has a shorter wavelength, whereby the plurality of laser beams are transmitted through the bandpass filter, and an inclination angle of the reflecting surface with respect to a light emitting surface of the bandpass filter is provided such that the plurality of laser beams transmitted through the bandpass filter are reflected by the light emitting surface and the reflecting surface to be multiplexed with one another.

Advantageous Effects of Invention

In the wavelength-multiplexed light transmission module according to the invention of the present application, the lens radially emits the plurality laser beams. In addition, the bandpass filter transmits the plurality of laser beams therethrough due to the difference in incident angle of each laser beam. Furthermore, the plurality of laser beams emitted from the bandpass filter are multiplexed with one another by reflection with the mirror. Therefore, the plurality of laser beams having different wavelengths can be multiplexed with one another by one lens and one bandpass filter. Accordingly, the wavelength-multiplexed light transmission module according to the present invention does not require to include a plurality of lenses and a plurality of bandpass filters, so that the wavelength-multiplexed light transmission module can be miniaturized.

BRIEF DESCRIPTION OF DRAWINGS

FIG. 8 is a perspective view and a plan view of a wavelength-multiplexed light transmission module according to a comparative example.

FIG. 9 is a diagram showing the oscillation wavelengths of lasers according to a second embodiment.

DESCRIPTION OF EMBODIMENTS

Figure 1:
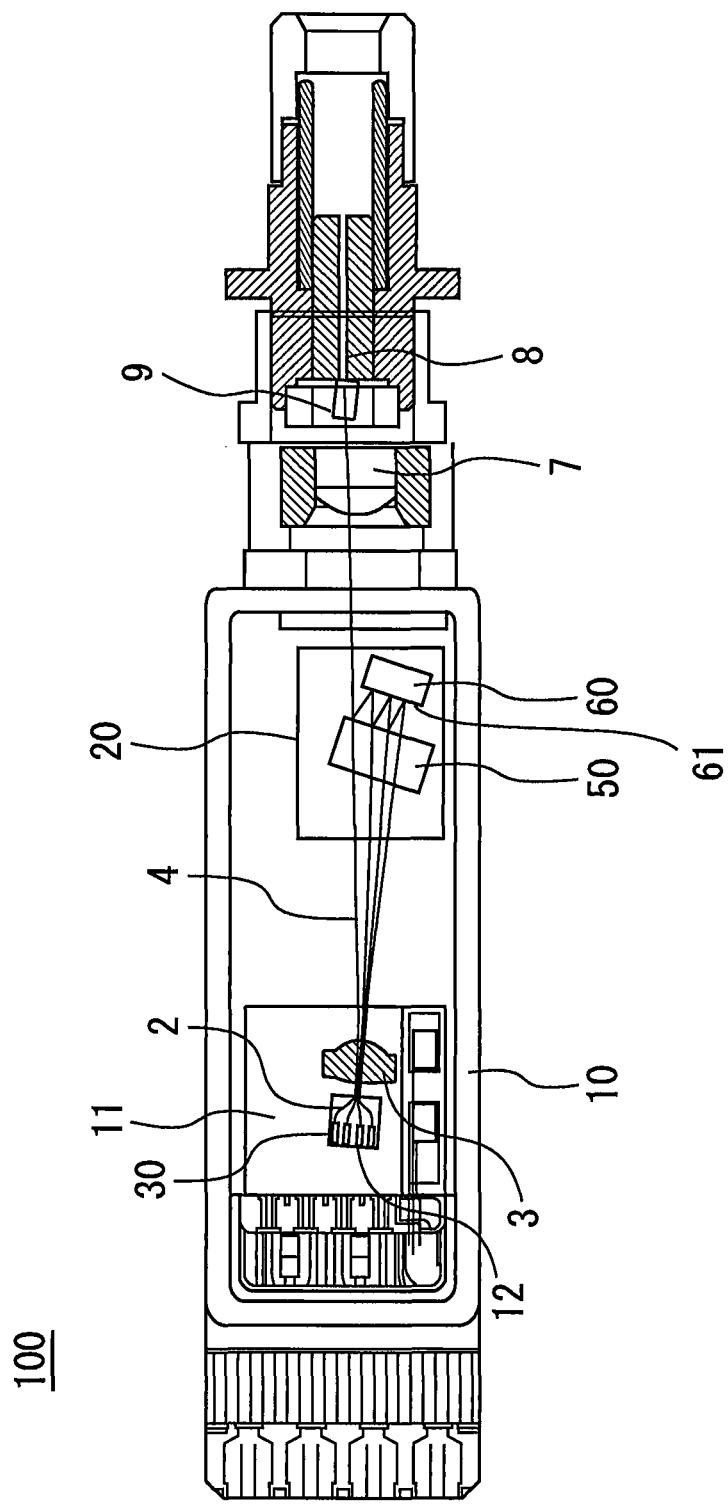
FIG. 1 is a plan view of a wavelength-multiplexed light transmission module according to a first embodiment.

A wavelength-multiplexed light transmission module and a method for manufacturing the same according to an embodiment of the present invention are described with reference to drawings. Identical or corresponding constitutional elements are given the same reference numerals, and the repeated description of such constitutional elements may be omitted.

First Embodiment

FIG. 1 is a plan view of a wavelength-multiplexed light transmission module 100 according to a first embodiment. The wavelength-multiplexed light transmission module 100 includes a laser array 30. The laser array 30 includes plural lasers 12. The plural lasers 12 respectively emit plural laser beams 4 which are different in wavelength from one another.

The laser array 30 includes plural waveguides 2 which are provided for the plural lasers 12, respectively. The waveguides 2 lead the laser beams 4 to an emitting end face of the laser array 30.

In the present embodiment, the laser array 30 includes four lasers 12. Each laser 12 is a modulator integrated LD (Electro-absorption Modulator Integrated Laser Diode (EML)). The laser array 30 is an EML array element which is monolithically integrated on one semiconductor chip. The laser beam 4 is modulated at 25 Gbps. The wavelength-multiplexed light transmission module 100 according to the present embodiment is provided so as to transmit a signal of 100 Gbps by 2 to 40 km.

A lens 3 is provided in a light emitting direction of the laser array 30. The lens 3 is provided on the optical path of the laser beams 4. The lens 3 is a collimating lens. The plural laser beams 4 are incident to the lens 3. The lens 3 radially emits the plural laser beams 4. The plural laser beams 4 emitted from the lens 3 spread at equal angular intervals. The focal length f of the lens 3 is equal to 0.7 mm.

A bandpass filter 50 is provided in a light emitting direction of the lens 3. The bandpass filter 50 includes a glass block and a thin film provided on a light incident surface side of the glass block. The thin film is formed by vapor deposition. The bandpass filter 50 transmits the plural laser beams 4 therethrough. A transmission bandwidth of the bandpass filter 50 is equal to 4 nm.

A mirror 60 is provided in a light emitting direction of the bandpass filter 50. The mirror 60 is provided on the optical path of the laser beams 4. The mirror 60 is provided to be inclined with respect to the bandpass filter 50. The mirror 60 is a total reflection mirror having a reflecting surface 61 for reflecting the plural laser beams 4. The four laser beams 4 are reflected by the bandpass filter 50 and the mirror 60, whereby the four laser beams 4 are multiplexed.

A condenser lens 7 is provided on the optical path of the multiplexed laser beams 4. The condenser lens 7 condenses all the laser beams 4. An optical fiber 8 is provided at a position where the laser beams 4 are condensed by the condenser lens 7. An optical isolator 9 is provided between the condenser lens 7 and the optical fiber 8. The optical isolator 9 transmits therethrough light traveling to the optical fiber 8, and blocks light traveling in the opposite direction. The laser beams 4 are transmitted to the outside by the optical fiber 8.

The laser array 30 and the lens 3 are provided on a Peltier element 11. The Peltier element 11 cools the laser array 30. The laser array 30 is kept, for example, at 40° C. by the Peltier element 11. Therefore, the oscillation wavelengths $\lambda_N$ of the lasers 12 can be prevented from fluctuating due to an outside air temperature.

The bandpass filter 50 and the mirror 60 are provided on a mounting flat plate 20. The laser array 30, the lens 3, the bandpass filter 50, the mirror 60, the Peltier element 11, and the mounting flat plate 20 are sealed by a package 10. The lasers 12 are hermetically sealed by the package 10.

Figure 2:
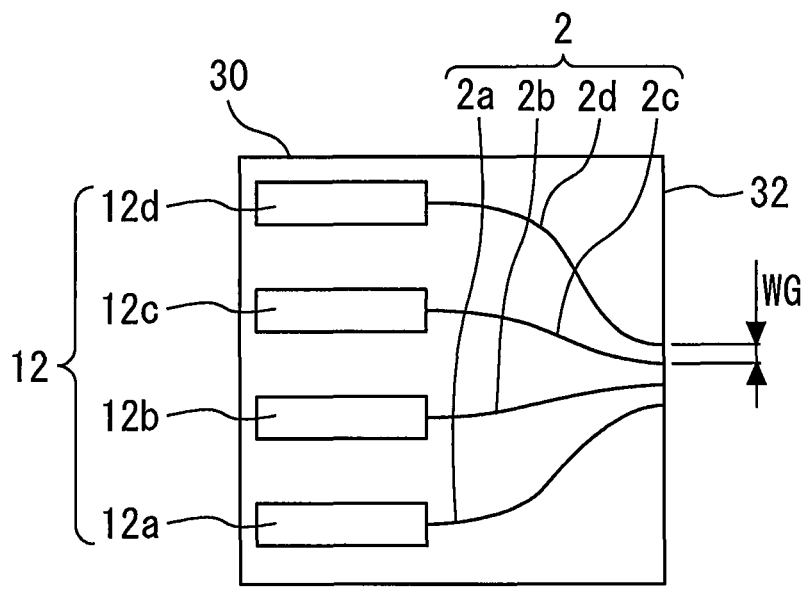
FIG. 2 is a plan view of a laser array according to the first embodiment.

FIG. 2 is a plan view of the laser array 30 according to the first embodiment. The plural lasers 12 include a first laser 12a, a second laser 12b, a third laser 12c, and a fourth laser 12d. The oscillation wavelength $\lambda_1$ of the first laser 12a is equal to 1295.56 nm. The oscillation wavelength $\lambda_2$ of the second laser 12b is equal to 1300.05 nm. The oscillation wavelength $\lambda_3$ of the third laser 12c is equal to 1304.58 nm. The oscillation wavelength $\lambda_4$ of the fourth laser is equal to 1309.14 nm. The oscillation wavelengths $\lambda_N$ of the first to fourth lasers 12a to 12d are wavelengths provided by an LAN-WDM (Local Area Network-Wavelength Division Multiplexing) standard.

The waveguides 2 include a first waveguide 2a, a second waveguide 2b, a third waveguide 2c, and a fourth waveguide 2d. The first to fourth waveguides 2a to 2d guide the laser beams 4 modulated by the first to fourth lasers 12a to 12d to an emitting end face 32, and emit the laser beams 4 into the space. The laser array 30 emits the plural laser beams 4 from the emitting end face 32.

The first to fourth waveguides 2a to 2d are arranged at equal intervals on the emitting end face 32. The interval WG between the adjacent waveguides 2 on the emitting end face 32 is equal to 33.85 μm. The interval WG is formed with an accuracy of ±0.05 μm by a semiconductor process.

The emitting end face 32 is positioned at the focal position of the lens 3. Therefore, the four laser beams 4 emitted from the lens 3 become collimated lights. Here, the first to fourth waveguides 2a to 2d are arranged at equal intervals on the emitting end face 32. Therefore, an angle Δθ between the mutually adjacent laser beams 4 out of the plural laser beams 4 emitted radially from the lens 3 is constant. The angle Δθ is expressed as follows.

[Math. 1]

$$\Delta\theta = \tan^{-1}\frac{WG}{f} \quad (1)$$

As a result, Δθ=2.768° is obtained. Accordingly, the four laser beams 4 are incident to the bandpass filter 50 at different incident angles, respectively. Here, the bandpass filter 50 generally has a shorter transmission center wavelength $\lambda_c$ as the incident angle is larger. The transmission center wavelength $\lambda_c$ of the bandpass filter 50 is expressed as follows.

[Math. 2]

$$\lambda_C = \lambda_0 \cdot \sqrt{1 - \left(\frac{\sin\theta_N}{n}\right)^2} \quad (2)$$

Here, $\theta_N$ represents the incident angle to the bandpass filter 50. $\lambda_o$ represents the transmission center wavelength when the incident angle to the bandpass filter 50 is equal to 0°. Furthermore, n represents an effective refractive index of the bandpass filter 50.

Figure 3:
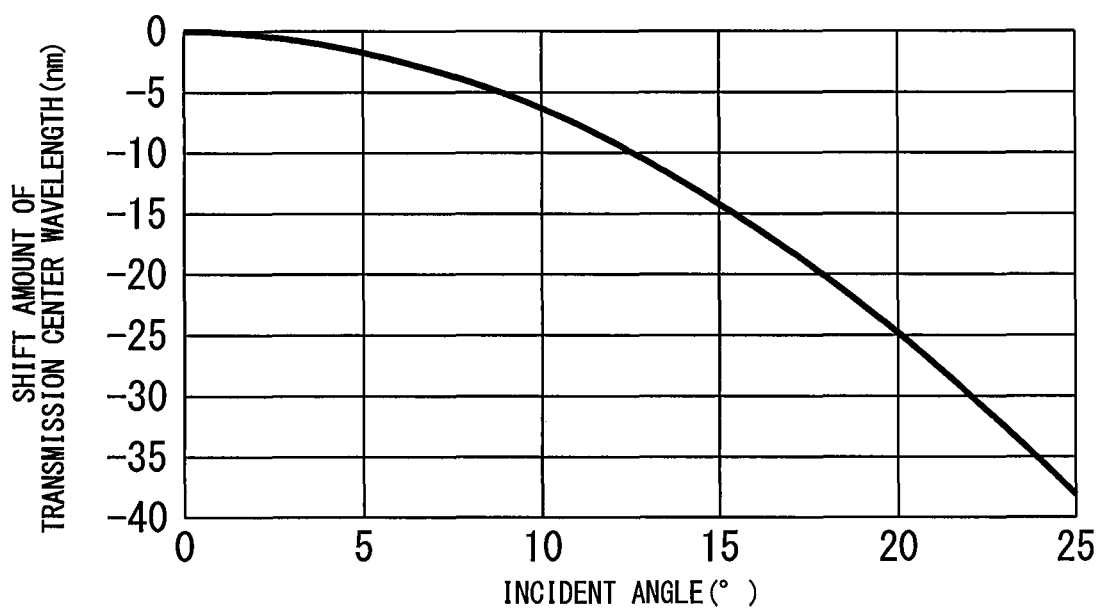
FIG. 3 is a diagram showing the relationship between an incident angle to a bandpass filter and a shift amount of a transmission center wavelength.

FIG. 3 is a diagram showing the relationship between the incident angle $\theta_N$ to the bandpass filter 50 and the shift amount of the transmission center wavelength $\lambda_c$. Here, the shift amount is a variation amount of the transmission center wavelength $\lambda_c$ from the transmission center wavelength $\lambda_o$ when the incident angle is equal to 0°. As the incident angle $\theta_N$ increases, the absolute value of the shift amount of the transmission center wavelength $\lambda_c$ becomes larger. That is, as the incident angle $\theta_N$ increases, the transmission center wavelength $\lambda_c$ becomes shorter. Here, the relationship between the incident angle $\theta_N$ and the transmission center wavelength $\lambda_c$ is nonlinear. The slope of the shift amount is small at the incident angle $\theta_N$ which is in the vicinity of 0°, but becomes steeper as the incident angle $\theta_N$ increases.

Figure 4:
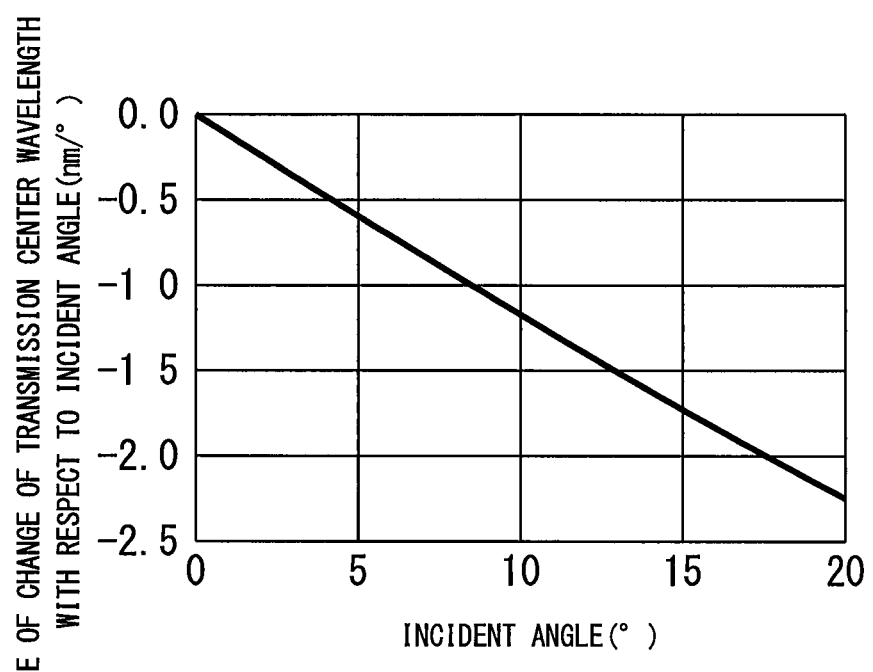
FIG. 4 is a diagram showing the rate of change of the transmission center wavelength with respect to the incident angle to the bandpass filter.

FIG. 4 is a diagram showing the rate of change of the transmission center wavelength $\lambda_c$ with respect to the incident angle $\theta_N$ to the bandpass filter 50. As the incident angle $\theta_N$ increases, the absolute value of the rate of change of the transmission center wavelength $\lambda_c$ becomes larger. Therefore, as the incident angle $\theta_N$ increases, it is possible to obtain a large change in the transmission center wavelength $\lambda_c$ with a small angular change.

Figure 5:
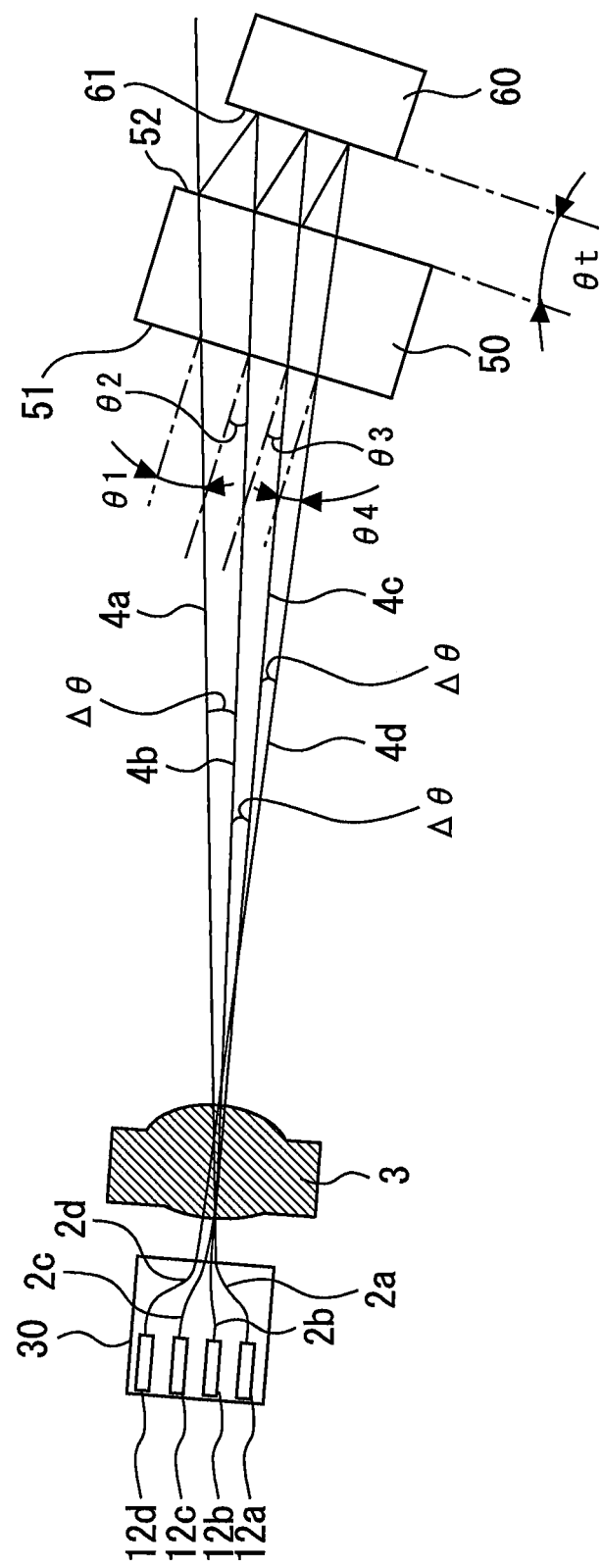
FIG. 5 is an enlarged view of the wavelength-multiplexed light transmission module according to the first embodiment.

FIG. 5 is an enlarged view of the wavelength-multiplexed light transmission module 100 according to the first embodiment. In FIG. 5, for the sake of convenience, the Peltier element 11 and the mounting flat plate 20 are omitted. The laser beams 4 emitted from the first to fourth lasers 12a to 12d are the first laser beam 4a, the second laser beam 4b, the third laser beam 4c, and the fourth laser beam 4d, respectively. The first to fourth laser beams 4a to 4d are incident to a light incident surface 51 of the bandpass filter 50.

The incident angle $\theta_1$ of the first laser beam 4a to the bandpass filter 50 is equal to 18.306°. The incident angle $\theta_2$ of the second laser beam 4b to the bandpass filter 50 is equal to 15.537°. The incident angle $\theta_3$ of the third laser beam 4c to the bandpass filter 50 is equal to 12.769°. The incident angle $\theta_4$ of the fourth laser beam 4d to the bandpass filter 50 is equal to 10°. The interval between the incident angles $\theta_1$ to $\theta_4$ satisfies Δθ=2.768°.

The transmission center wavelength $\lambda_c$ with respect to the incident angle $\theta_1$ is equal to 1295.14 nm. The transmission center wavelength $\lambda_c$ with respect to the incident angle $\theta_2$ is equal to 1300.48 nm. The transmission center wavelength $\lambda_c$ with respect to the incident angle $\theta_3$ is equal to 1305.02 nm. The transmission center wavelength $\lambda_c$ with respect to the incident angle $\theta_4$ is equal to 1308.71 nm.

Here, the transmission bandwidth of the bandpass filter 50 is equal to ±2 nm with respect to the transmission center wavelength $\lambda_c$. The oscillation wavelengths $\lambda_N$ of the first to fourth lasers 12a to 12d are within ±2 nm from the transmission center wavelength $\lambda_c$ with respect to the incident angles $\theta_1$ to $\theta_4$ of the first to fourth laser beams 4a to 4d. Accordingly, the first to fourth laser beams 4a to 4d can pass through the bandpass filter 50. In the present embodiment, the plural laser beams 4 are incident to the bandpass filter 50 such that the incident angle $\theta_N$ of the laser beam 4 is increased as the wavelength of the laser beam 4 is shorter, whereby the plural laser beams 4 pass through the bandpass filter 50.

The first to fourth laser beams 4a to 4d transmitted through the bandpass filter 50 are emitted from a light emitting surface 52 of the bandpass filter 50. The light emitting surface 52 is a surface from which the first to fourth laser beams 4a to 4d are emitted in the bandpass filter 50. The light incident surface 51 and the light emitting surface 52 are parallel to each other.

Here, the inclination angle $\theta_t$ of the reflecting surface 61 of the mirror 60 with respect to the light emitting surface 52 of the bandpass filter 50 is provided so that the plural laser beams 4 transmitted through the bandpass filter 50 are reflected by the light emitting surface 52 and the reflecting surface 61 to be multiplexed with one another. The inclination angle $\theta_t$ is an inclination angle in plan view. In the present embodiment, the inclination angle $\theta_t$ is one-half of the angle Δθ. That is, $\theta_t$=Δθ/2=1.384°. The light emitting surface 52 and the reflecting surface 61 are perpendicular to the top surface of the mounting flat plate 20.

At this time, an angle change of $2\theta_t$ occurs in the fourth laser beam 4d due to reflection at the mirror 60. Therefore, the reflection of the fourth laser beam 4d by the mirror 60 causes the fourth laser beam 4d to overlap the third laser beam 4c. Likewise, the third laser beam 4c is reflected by the mirror 60, which causes the third laser beam 4c to overlap the second laser beam 4b. In addition, the second laser beam 4b is reflected by the mirror 60, which causes the second laser beam 4b to overlap the first laser beam 4a. The first laser beam 4a is not reflected by the mirror, and travels to the condenser lens 7 side.

Accordingly, the first to fourth laser beams 4a to 4d are multiply reflected between the reflecting surface 61 and the light emitting surface 52 and sequentially multiplexed with one another. As a result, the first to fourth laser beams 4a to 4d overlap one another and become one light. The first to fourth laser beams 4a to 4d, which have become one light, are emitted from the package 10. The first to fourth laser beams 4a to 4d emitted from the package 10 are condensed by the condenser lens 7, transmitted through the optical isolator 9, and guided by the optical fiber 8. The first to fourth laser beams 4a to 4d become a waveguide mode of the optical fiber 8 of the single mode. As a result, a signal of 100 Gbps is transmitted from the optical fiber 8.

Next, a condition for obtaining high coupling efficiency when the first to fourth laser beams 4a to 4d are multiplexed by a multiplexing optical system including the bandpass filter 50 and the mirror 60 will be described. First, since the inclination angle $\theta_t$ is half the angle $\Delta\theta$, the following expression can be obtained by transforming Expression 1.

[Math. 3]

$$WG = f \times \tan(2 \times \theta_t) \quad (3)$$

From Expression 3, the interval WG of the waveguides 2 that makes it possible to suppress a multiplexing loss in the wavelength multiplexing can be obtained. Here, generally, an error of about 10% of a mode field diameter MFD of the waveguides 2 is allowed for the interval WG of the waveguides 2. Therefore, when the interval WG satisfies Expression 4, it enables multiplexing in the wavelength-multiplexed light transmission module 100.

[Math. 4]

$$|WG - f \times \tan(2 \times \theta_t)| \leq MFD/10 \quad (4)$$

Figures 6, 7:
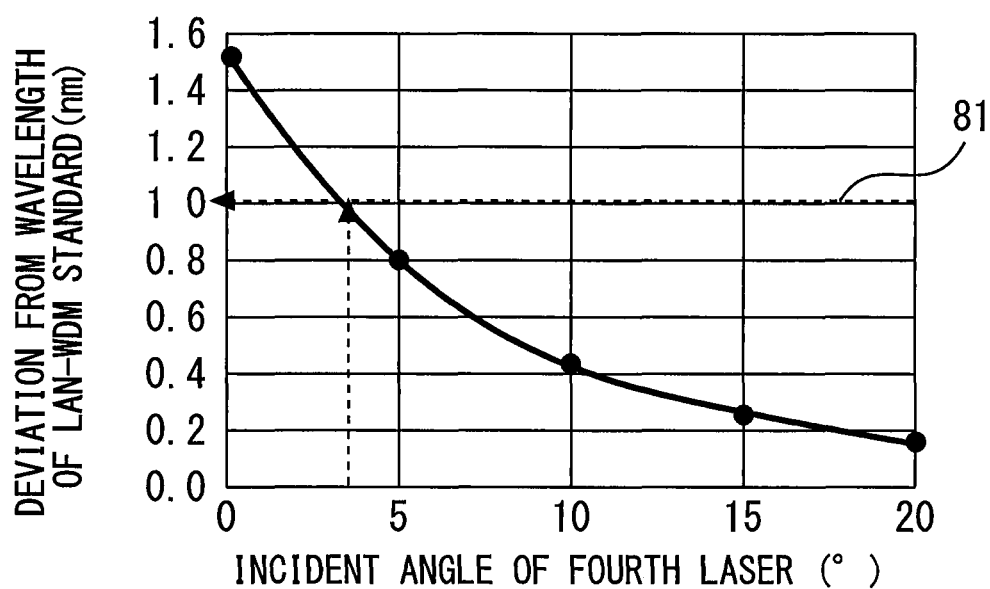
FIG. 6 shows a wavelength array of the LAN-WDM standard.
FIG. 7 is a diagram showing the deviation between the wavelength array of the LAN-WDM standard and the transmission center wavelength of the bandpass filter.

Generally, there are restrictions on wavelength grids to be multiplexed in a communication system. It is assumed that the wavelength-multiplexed light transmission module 100 according to the present embodiment is used for communication of a LAN-WDM system. FIG. 6 shows a wavelength array of the LAN-WDM standard. As shown in lanes L0 to L3, four wavelengths are provided in the LAN-WDM standard. In the lanes L0 to L3, the interval of optical frequencies is equal to 800 GHz, and the interval of wavelengths is about 4.53 nm.

Since the wavelength array of the LAN-WDM standard is a substantially equal interval, in order to apply the wavelength-multiplexed light transmission module 100 according to the present embodiment to the communication of the LAN-WDM system, it is necessary that the transmission center wavelength $\lambda_c$ of the bandpass filter 50 changes approximately linearly with respect to the incident angle $\theta_N$. Therefore, when the transmission center wavelength $\lambda_c$ changes nonlinearly with respect to the incident angle $\theta_N$, there is a possibility that loss occurs due to the shift between the oscillation wavelength $\lambda_N$ and the transmission center wavelength $\lambda_c$ at any wavelength.

Here, as shown in FIG. 4, as the incident angle $\theta_N$ is larger, the rate of change of the transmission center wavelength $\lambda_c$ becomes larger. That is, as the incident angle $\theta_N$ is larger, the dependence of the transmission center wavelength $\lambda_c$ on the incident angle $\theta_N$ approaches linear dependence. Therefore, by setting the incident angle $\theta_N$ to a large value, it is possible to suppress the loss caused by the shift between the oscillation wavelength $\lambda_N$ and the transmission center wavelength $\lambda_c$.

FIG. 7 is a diagram showing the deviation between the wavelength array of the LAN-WDM standard and the transmission center wavelength $\lambda_c$ of the bandpass filter 50. The abscissa axis of FIG. 7 represents the incident angle $\theta_4$ of the fourth laser beam 4d. Since the fourth laser beam 4d has the smallest incident angle $\theta_N$ among the laser beams 4, the deviation becomes the largest. As shown in FIG. 7, the deviation between the wavelength array of the LAN-WDM standard and the transmission center wavelength $\lambda_c$ is smaller as the incident angle $\theta_4$ is larger.

In the present embodiment, the incident angle $\theta_N$ is set to 3° or more. At this time, as indicated by a broken line 81, the deviation from the wavelength of the LAN-WDM standard can be suppressed within 1 nm even in the case of the fourth laser beam 4d having the largest deviation. In the present embodiment, the transmission bandwidth of the bandpass filter 50 is equal to ±2 nm with respect to the transmission center wavelength $\lambda_c$. Therefore, when the first to fourth laser beams 4a to 4d have the wavelength of the LAN-WDM standard, all the laser beams 4 can pass through the bandpass filter 50. Therefore, the wavelength-multiplexed light transmission module 100 can be applied to the communication of the LAN-WDM system.

Note that the oscillation wavelength of the laser may generally vary by about ±0.5 nm due to variations in a semiconductor manufacturing process. In consideration of this variation, in the first embodiment, the incident angle $\theta_N$ of the fourth laser beam 4d is set to 10°. At this time, the maximum deviation between the wavelength array of the LAN-WDM standard and the transmission center wavelength $\lambda_c$ can be suppressed to 0.44 nm. At this time, a manufacturing margin of 0.5 nm or more can be secured for the transmission bandwidth of the bandpass filter 50 with respect to a use wavelength range of the LAN-WDM standard shown in FIG. 6.

FIG. 8 is a perspective view and a plan view of a wavelength-multiplexed light transmission module 200 according to a comparative example. The wavelength-multiplexed light transmission module 200 includes four lasers 212 having different wavelengths from one another. A lens 203 is provided in a light emitting direction of each laser 212. A laser beam emitted from each laser 212 becomes collimated light through the lens 203. In addition, the wavelength-multiplexed light transmission module 200 includes three bandpass filters 250 in order to multiplex the four laser beams having different wavelengths from one another. The three bandpass filters 250 and the mirror 260 are held in parallel to one another by a holder 220. The laser beams are reflected and multiplexed between the bandpass filters 250 and the mirror 260.

In the wavelength-multiplexed light transmission module 200 according to the comparative example, the lenses 203 whose number is equal to that of the lasers 212 and the bandpass filters 250 whose number is smaller than that of the lasers 212 by one are required. At this time, it may be difficult to miniaturize the wavelength-multiplexed light transmission module 200.

In contrast, the wavelength-multiplexed light transmission module 100 according to the present embodiment includes only one lens 3 and only one bandpass filter 50. Accordingly, the wavelength-multiplexed light transmission module 100 can be miniaturized. Furthermore, since the wavelength-multiplexed light transmission module 100 has only one lens 3, the interval WG between the adjacent waveguides 2 can be reduced. Therefore, the plural lasers 12 can be monolithically integrated. Therefore, it is enough only to provide one laser array 30, and the wavelength-multiplexed light transmission module 100 can be further miniaturized. At this time, the interval WG between the adjacent waveguides 2 can be formed with high accuracy of ±0.05 μm by a semiconductor process.

In addition, the laser beams 4 emitted from the lens 3 spread at equal angular intervals. The angular accuracy at this time is equal to ±0.004°. Generally, the angular accuracy required for collimated light is equal to ±0.05° or less. Accordingly, light control by the lens 3 in the present embodiment can cope with an angular accuracy requirement of the collimated light with a margin.

Furthermore, the laser beams 4 which are radially incident to the bandpass filter 50 become one wavelength-multiplexed light flux by reflection from the mirror 60 which is placed in a wedge-shaped arrangement with respect to the bandpass filter 50. Accordingly, in the present embodiment, it is possible to perform the optical axis adjustment on the plural laser beams 4 in a lump. Therefore, it is possible to facilitate the optical axis adjustment as compared with the comparative example.

Furthermore, in the present embodiment, since it is enough only to provide one lens 3, one bandpass filter 50 and one laser array 30, the manufacturing cost can be suppressed. In addition, assembly is facilitated, and mass productivity can be enhanced. Furthermore, in the wavelength-multiplexed light transmission module 200 according to the comparative example, the numbers of the lenses 203 and the bandpass filters 250 increase as the number of wavelengths to be multiplexed increases. Along with this increase, the manufacturing cost and the cost of parts may increase. In contrast, in the present embodiment, it is enough only to provide one lens 3, one bandpass filter 50, and one laser array 30 regardless of the number of wavelengths to be multiplexed. Therefore, it is possible to suppress an increase in the manufacturing cost and the cost of parts accompanying the increase in the number of wavelengths to be multiplexed.

Furthermore, the inclination angle $\theta_t$ and the interval WG between the adjacent waveguides 2 satisfy the relationship of Expression 4, whereby the coupling loss between all the lasers 4 and the optical fiber 8 can be controlled in a lump. Furthermore, since the laser beams 4 are emitted from the lens 3 while radially spreading, the laser array 30 can be reduced in size to a fraction or less of the bandpass filter 50. Therefore, in the present embodiment, the laser array 30 can be miniaturized. Generally, the manufacturing cost of a semiconductor chip increases as the chip size increases. Therefore, in the present embodiment, the manufacturing cost of the laser array 30 can be suppressed.

Furthermore, by setting the incident angle $\theta_N$ to 3° or more, the relationship between the incident angle $\theta_N$ and the transmission center wavelength $\lambda_c$ can be approached to linearity. Thus, the wavelength-multiplexed light transmission module 100 according to the present embodiment can be applied to communication applications in which wavelength arrays such as the wavelength array of the LAN-WDM standard are arranged at equal intervals.

In the present embodiment, each laser 12 is assumed to be a modulator integrated LD. As a modification, the laser 12 may be an LD. In this case, the laser array 30 is an LD array element. When an LD having no external modulator is used as the laser 12, modulation of 25 Gbps is directly applied to LD drive current. This modification can also obtain the same effect as in the first embodiment.

In the present embodiment, the laser array 30 has four lasers 12. As a modification, the number of the lasers 12 included in the laser array 30 may be two or more. Furthermore, the mounting flat plate 20 may not be provided, and the bandpass filter 50 and the mirror 60 may be directly provided on a mounting flat surface of the package 10.

Furthermore, in the present embodiment, the mirror 60 is provided so as to reflect the second to fourth laser beams 4b to 4d therefrom and so as not to reflect the first laser beam 4a therefrom. At this time, the bandpass filter 50 and the mirror 60 are arranged to be inclined so that the distance between the bandpass filter 50 and the mirror 60 is smaller on the side of the fourth laser beam 4d than that on the side of the first laser beam 4a.

As a modification, the mirror 60 may be provided so as to reflect the first to third laser beams 4a to 4c therefrom and so as not to reflect the fourth laser beam 4d therefrom. At this time, the bandpass filter 50 and the mirror 60 are arranged so as to be inclined so that the distance between the bandpass filter 50 and the mirror 60 is smaller on the side of the first laser beam 4a than that on the side of the fourth laser beam 4d. In this modification, the four laser beams 4 can be multiplexed by the inclination of the bandpass filter 50 and the mirror 60.

These modifications can be applied, as appropriate, to a wavelength-multiplexed light transmission module and a method for manufacturing the same according to the following embodiments. Note that the wavelength-multiplexed light transmission module and the method for manufacturing the same according to the following embodiments are similar to those of the first embodiment in many respects, and thus differences between the wavelength-multiplexed light transmission module and the method for manufacturing the same according to the following embodiments and those of the first embodiment will be mainly described below.

Second Embodiment

FIG. 9 is a diagram showing the oscillation wavelengths $\lambda_N$ of lasers 12 according to a second embodiment. In the present embodiment, the oscillation wavelengths $\lambda_N$ of the lasers 12 are different from those in the first embodiment. In the first embodiment, it is assumed that the oscillation wavelengths $\lambda_N$ of the plural lasers 12 are coincident with the wavelength array of the LAN-WDM standard. On the other hand, the intervals between the oscillation wavelengths $\lambda_N$ of the plural lasers 12 may be uneven within the use wavelength range shown in FIG. 9.

As shown in FIG. 9, in the present embodiment, for each of the plural lasers 12, the oscillation wavelength $\lambda_N$ of the laser beam 4 emitted from the laser 12 is set in conformity with the transmission center wavelength $\lambda_c$ corresponding to the incident angle $\theta_N$ of the laser beam 4. Therefore, in each of the plural lasers 12, the oscillation wavelength $\lambda_N$ of the laser beam 4 emitted from the laser 12 satisfies the following Expression 5. Expression 5 is obtained from Expression 2.

[Math. 5]

$$\lambda_N = \lambda_0 \cdot \sqrt{1 - \left(\frac{\sin\theta_N}{n}\right)^2} \pm 0.5 \text{ nm} \qquad (5)$$

The incident angle $\theta_N$ of an Nth laser beam 4 can be obtained from Expression 6. Here, the first to fourth laser beams 4 correspond to the first to fourth laser beams 4a to 4d, respectively.

[Math. 6]

$$\theta_N = \theta_{min} + 2(4-N)\theta_t \qquad (6)$$

Here, $\theta_{min}$ represents the smallest incident angle among the incident angles $\theta_N$ of the plural laser beams 4. In addition, ±0.5 nm which is a final term of Expression 5 indicates an unavoidable variation of the oscillation wavelength $\lambda_N$ caused by production tolerance of semiconductor process.

Figure 10:
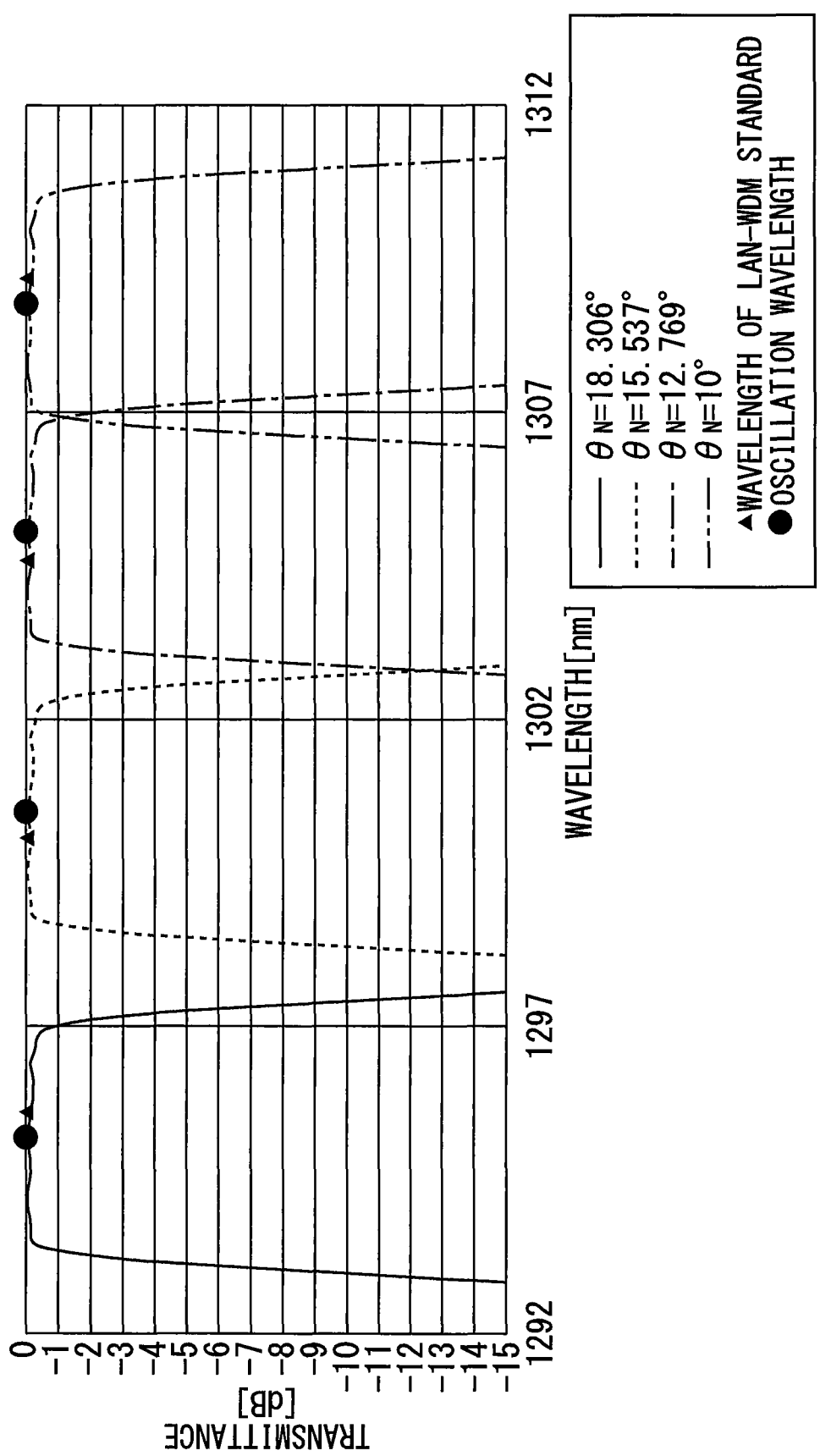
FIG. 10 is a diagram showing transmission characteristics of the bandpass filter.

FIG. 10 is a diagram showing transmission characteristics of the bandpass filter 50. In the present embodiment, the oscillation wavelengths $\lambda_N$ of the first to fourth lasers 12a to 12d are different from the wavelength array of the LAN-WDM standard by 0.44 nm at maximum. On the other hand, the oscillation wavelengths $\lambda_N$ of the first to fourth lasers 12a to 12d are coincident with the transmission center wavelengths $\lambda_c$ corresponding to the incident angles $\theta_N$ of the respective laser beams 4. At this time, even when the oscillation wavelength $\lambda_N$ deviates from a target by about ±0.5 nm due to the production tolerance, the oscillation wavelengths $\lambda_N$ of the first to fourth lasers 12a to 12d can be set within the transmission band of the bandpass filter 50. Furthermore, all wavelengths can be multiplexed with a low loss of 0.5 dB or less.

In the present embodiment, the oscillation wavelength $\lambda_N$ of the laser beam 4 is set in conformity with the transmission center wavelength $\lambda_c$ corresponding to the incident angle $\theta_N$ of the laser beam 4. Therefore, as compared with the first embodiment, the transmittance of the laser beam 4 in the bandpass filter 50 can be improved. Therefore, a light output from the wavelength-multiplexed light transmission module 100 can be enhanced.

Furthermore, the oscillation wavelength $\lambda_N$ of the laser 4 and the transmission center wavelength $\lambda_c$ of the bandpass filter 50 can be made coincident with each other with an error of ±0.5 nm or less. Therefore, occurrence of defects caused by excessive deviation between the oscillation wavelength $\lambda_N$ and the transmission center wavelength $\lambda_c$ can be prevented. Therefore, it is possible to suppress the rate of occurrence of defects and suppress the manufacturing cost. An effect of matching the oscillation wavelength $\lambda_N$ to the transmission center wavelength $\lambda_c$ becomes more conspicuous as the transmission bandwidth of the bandpass filter 50 becomes narrower.

Third Embodiment

Figure 11:
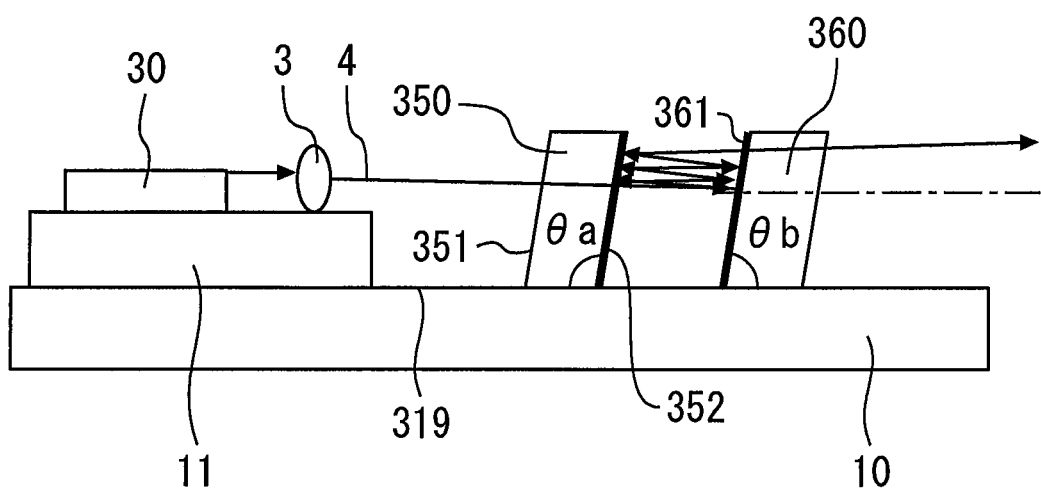
FIG. 11 is a front view of a wavelength-multiplexed light transmission module according to a third embodiment.

FIG. 11 is a front view of a wavelength-multiplexed light transmission module 300 according to a third embodiment. The third embodiment is different from the first embodiment in the structures of a bandpass filter 350 and a mirror 360. The bandpass filter 350 and the mirror 360 are mounted on a mounting flat surface 319 of the package 10. A light incident surface 351 and a light emitting surface 352 of the bandpass filter 350 are parallel to each other. The light emitting surface 352 is inclined with respect to a direction perpendicular to the mounting flat surface 319. Furthermore, a reflecting surface 361 of the mirror 360 is inclined with respect to a direction perpendicular to the mounting flat surface 319. Note that like the first embodiment, an angle between the light emitting surface 352 and the reflecting surface 361 in a plan view is an inclination angle $\theta_t$.

An intersection angle between the mounting flat surface 319 and the light emitting surface 352 is represented by $\theta_a$. An intersection angle between the mounting flat surface 319 and the reflecting surface 361 is represented by $\theta_b$. The angle $\theta_a$ and the angle $\theta_b$ are supplementary to each other. Also, in the present embodiment, the laser beams 4 are subjected to multiple reflection between the light emitting surface 352 and the reflecting surface 361 to be multiplexed with one another.

Figure 12:
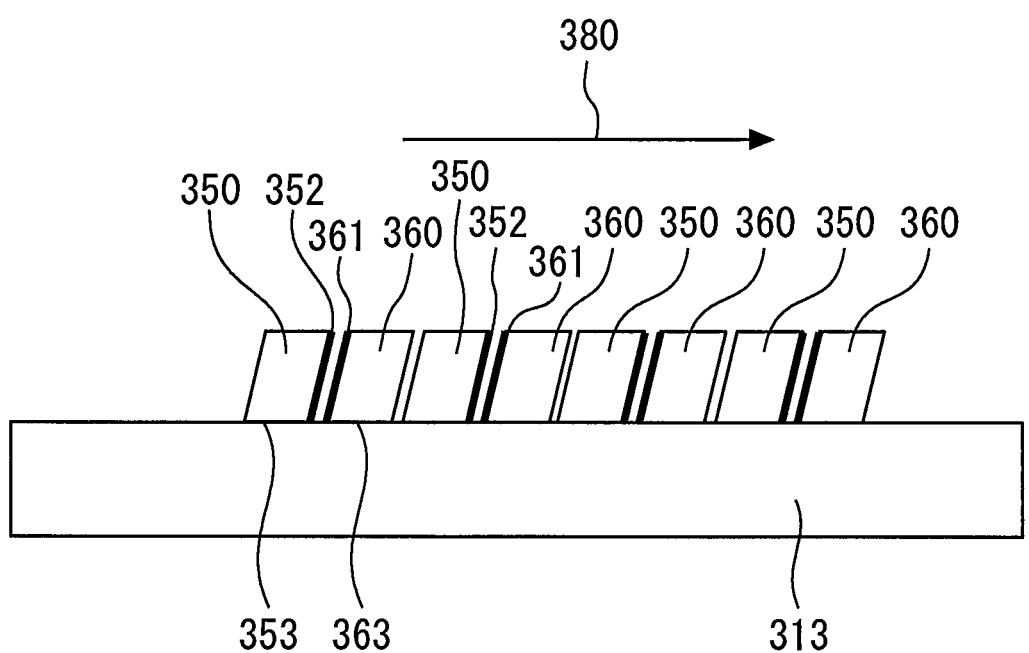
FIG. 12 is a diagram showing the method for manufacturing the wavelength-multiplexed light transmission module according to the third embodiment.

Next, a method for manufacturing the wavelength-multiplexed light transmission module 300 will be described. FIG. 12 is a diagram showing the method for manufacturing the wavelength-multiplexed light transmission module 300 according to the third embodiment. First, the reflecting surface 361 of the mirror 360 and the light emitting surface 352 of the bandpass filter 350 are brought into contact with each other and brought into close contact with each other. Next, the mirror 360 and the bandpass filter 350 are mounted on a polishing board 313 while keeping a state where the reflecting surface 361 and the light emitting surface 352 are in contact with each other. Here, a mounting surface 363 of the mirror 360 and a mounting surface 353 of the bandpass filter 350 are brought into contact with the polishing board 313. The mounting surface 363 of the mirror 360 and the mounting surface 353 of the bandpass filter are surfaces to be mounted on the mounting flat surface 319.

Next, the mirror 360 and the bandpass filter 350 are moved in a direction indicated by an arrow 380 with respect to the polishing board 313. As a result, the mounting surface 363 of the mirror 360 and the mounting surface 353 of the bandpass filter 350 are polished. By simultaneously polishing the mirror 360 and the bandpass filter 350 on the polishing board 313, the mirror 360 and the bandpass filter 350 are formed so that the angle $\theta_a$ and the angle $\theta_b$ have a supplementary relationship with each other.

In the first embodiment, the mirror 60 and the bandpass filter 50 are assembled with reference to the upper surface of the mounting flat plate 20. At this time, the light emitting surface 52 and the reflecting surface 61 are formed so as to be perpendicular to the upper surface of the mounting flat plate 20. However, in general, when a processing method capable of performing mass production industrially is used, the squareness of the optical surfaces of the bandpass filter and the mirror with respect to the mounting flat surface may be equal to about ±0.5° in processing accuracy in some cases.

In contrast, in the present embodiment, it is enough for the angle $\theta_a$ and the angle $\theta_b$ to have a supplementary relationship with each other. Therefore, the light emitting surface 352 and the reflecting surface 361 are not required to form a highly precise right angle with respect to the mounting flat surface 319. Therefore, optical parts can be manufactured at low cost. In addition, the bandpass filter 350 and the mirror 360 can be manufactured at low cost by the method for manufacturing the wavelength-multiplexed light transmission module 300 according to the present embodiment.

Here, in order to suppress the loss in the wavelength multiplexing in the wavelength-multiplexed light transmission module 300, an allowable error between the angle $\theta_a$ and the angle $\theta_b$ will be described. A mode field of the multiplexed laser beams 4 and a mode field of the optical fiber 8 overlap each other by 50% or more, whereby it is possible to suppress the loss in wavelength multiplexing. That is, by satisfying Expression 7, the loss in wavelength multiplexing can be suppressed.

[Math. 7]

$$|\theta_a + \theta_b - 180°| \le \left| \frac{1}{2(N-1)} \tan^{-1} \frac{MFD}{2f} \right| \qquad (7)$$

Here, in the present embodiment, MFD is equal to 2 μm. Furthermore, N represents the number of the plural lasers 12. From the foregoing, $\theta_a + \theta_b = 180 \pm 0.014°$ is satisfied. Therefore, $\theta_a$ and $\theta_b$ have a supplementary relationship with each other, and if the error is equal to ±0.014° or less, the wavelength multiplexing can be performed with a low loss.

Fourth Embodiment

Figure 13:
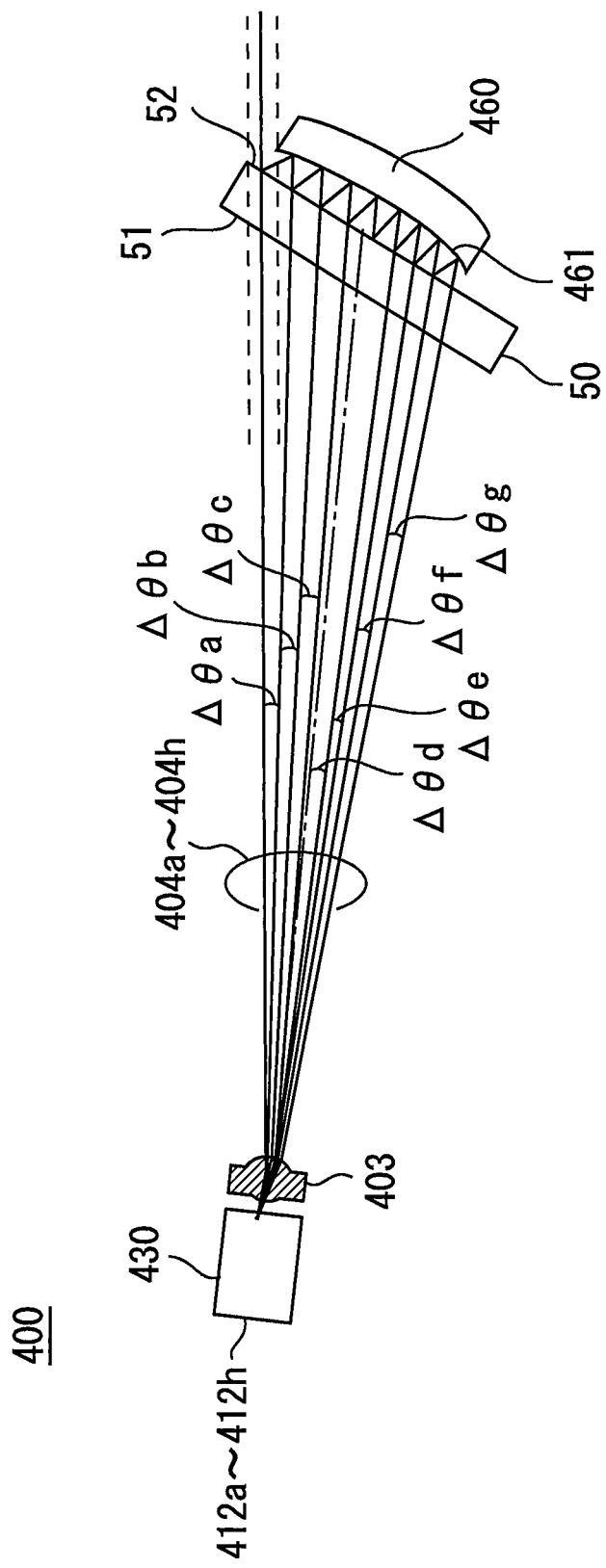
FIG. 13 is an enlarged view of a wavelength-multiplexed light transmission module according to a fourth embodiment.

FIG. 13 is an enlarged view of a wavelength-multiplexed light transmission module 400 according to a fourth embodiment. The present embodiment is different from the first embodiment in the structures of a laser array 430, a lens 403, and a mirror 460. Other structures are the same as those in the first embodiment. In FIG. 13, for the sake of convenience, the Peltier element 11 and the mounting flat plate 20 are omitted.

The laser array 430 includes eight lasers 412a to 412h. The plural lasers 412a to 412h emit plural laser beams 404a to 404h having different wavelengths from one another, respectively. The oscillation wavelengths $\lambda_N$ of the lasers 412a to 412h are wavelengths provided by the LAN-WDM standard which is an internal standard.

The laser array 430 includes plural waveguides provided for the lasers 412a to 412h, respectively. The waveguides lead the laser beams 404a to 404h to the emitting end face of the laser array 430.

The lens 403 is provided in a light emitting direction of the laser array 430. The laser beams 404a to 404h are incident to the lens 403. The lens 403 radially emits the plural laser beams 404a to 404h. In the present embodiment, respective angles between adjacent laser beams out of the laser beams 404a to 404h emitted from the lens 403 are not constant.

The angle between the first laser beam 404a and the second laser beam 404b is equal to $\Delta\theta_a$. The angle between the second laser beam 404b and the third laser beam 404c is equal to $\Delta\theta_b$. The angle between the third laser beam 404c and the fourth laser beam 404d is equal to $\Delta\theta_c$. The angle between the fourth laser beam 404d and the fifth laser beam 404e is equal to $\Delta\theta_d$. The angle between the fifth laser beam 404e and the sixth laser beam 404f is equal to $\Delta\theta_e$. The angle between the sixth laser beam 404f and the seventh laser beam 404g is equal to $\Delta\theta_f$. The angle between the seventh laser beam 404g and the eighth laser beam 404h is equal to $\Delta\theta_g$. The angles $\Delta\theta_a$ to $\Delta\theta_g$ are different from one another.

The bandpass filter 50 is provided in the light emitting direction of the lens 403. The plural laser beams 404a to 404h are incident to the bandpass filter 50 so that the incident angle $\theta_N$ of the laser beam 4 is larger as the wavelength of the laser beam 4 is shorter, whereby the plural laser beams 404a to 404h pass through the bandpass filter 50.

The mirror 460 has a reflecting surface 461. The reflecting surface 461 is a curved surface which is warped to an opposite side to the light emitting surface 52. That is, the reflecting surface 461 is a concave surface recessed with respect to the bandpass filter 50. The mirror 460 is formed, for example, by depositing a dielectric multilayer film on a glass material.

In the present embodiment, the inclination angle $\theta_t$ of the reflecting surface 461 of the mirror 460 with respect to the light emitting surface 52 of the bandpass filter 50 is also provided such that the plural laser beams 404a to 404h transmitted through the bandpass filter 50 are reflected by the light emitting surface 52 and the reflecting surface 461 to be multiplexed with one another. Here, the inclination angle $\theta_t$ is an angle in plan view between the light emitting surface 52 and the tangent line of the reflecting surface 461.

In the present embodiment, the inclination angle $\theta_t$ of the reflecting surface 461 with respect to the light emitting surface 52 varies depending on the position on the reflecting surface 461. The inclination angle $\theta_t$ is provided so that each of the plural laser beams 404b to 404h is reflected by the light emitting surface 52 and the reflecting surface 461 to be multiplexed with an adjacent laser beam. For example, the inclination angle $\theta_t$ between a portion for reflecting the second laser beam 404b out of the reflecting surface 461 and the light emitting surface 52 is set to $\Delta\theta_a/2$. As a result, the second laser beam 404b is reflected by the reflecting surface 461 to be multiplexed with the first laser beam 404a.

Figure 14:
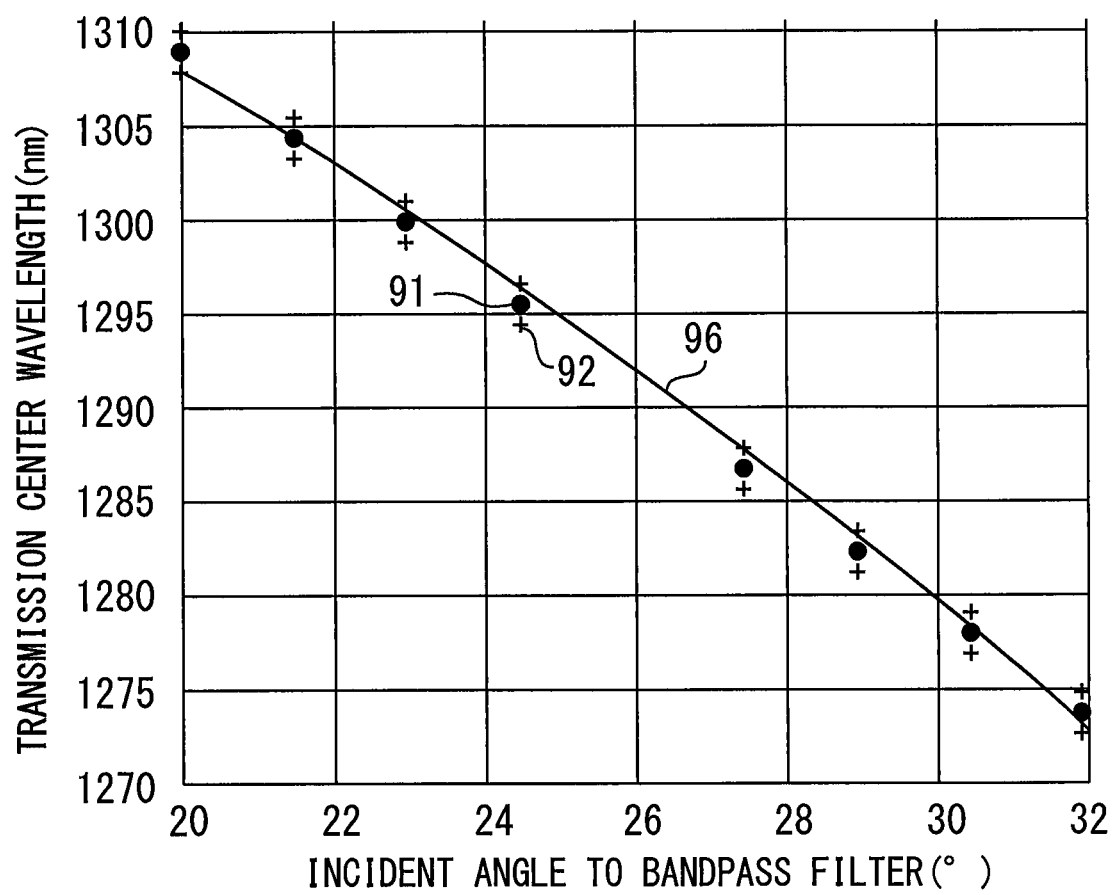
FIG. 14 is a diagram showing the relationship between the transmission center wavelength of the bandpass filter and the wavelength of the LAN-WDM standard when the reflecting surface is a flat surface.

Next, an effect of the present embodiment will be described. FIG. 14 is a diagram showing a comparative example of the present embodiment. FIG. 14 is a diagram showing the relationship between the transmission center wavelength $\lambda_c$ of the bandpass filter 50 and the wavelength of the LAN-WDM standard when the reflecting surface 461 is a flat surface. In the comparative example, the radius of curvature of the curved surface of the mirror 460 is infinite. That is, the reflecting surface 461 is a perfectly flat surface.

In FIG. 14, each point 91 indicates a center wavelength of the LAN-WDM standard. Crosses 92 displayed above and below each point 91 indicate upper and lower limit wavelengths of the LAN-WDM standard. A curved line 96 represents the transmission center wavelength $\lambda_c$ of the bandpass filter.

When the reflecting surface 461 is a flat surface, the angles $\Delta\theta_a$ to $\Delta\theta_h$ between the respective adjacent laser beams are equal to a fixed value or multiples of the fixed value. Furthermore, the wavelength array of the LAN-WDM standard is almost equally spaced from one another. From the foregoing, the wavelength array of the LAN-WDM standard is substantially linearly arranged with respect to the incident angle $\theta_N$ to the bandpass filter 50.

In contrast, the transmission center wavelength $\lambda_c$ of the bandpass filter 50 changes nonlinearly with respect to the incident angle $\theta_N$. At this time, the transmission center wavelength $\lambda_c$ approaches the upper limit or the lower limit of the LAN-WDM standard at some of channels of eight wavelengths. Therefore, a manufacturing margin may be insufficient.

Figure 15:
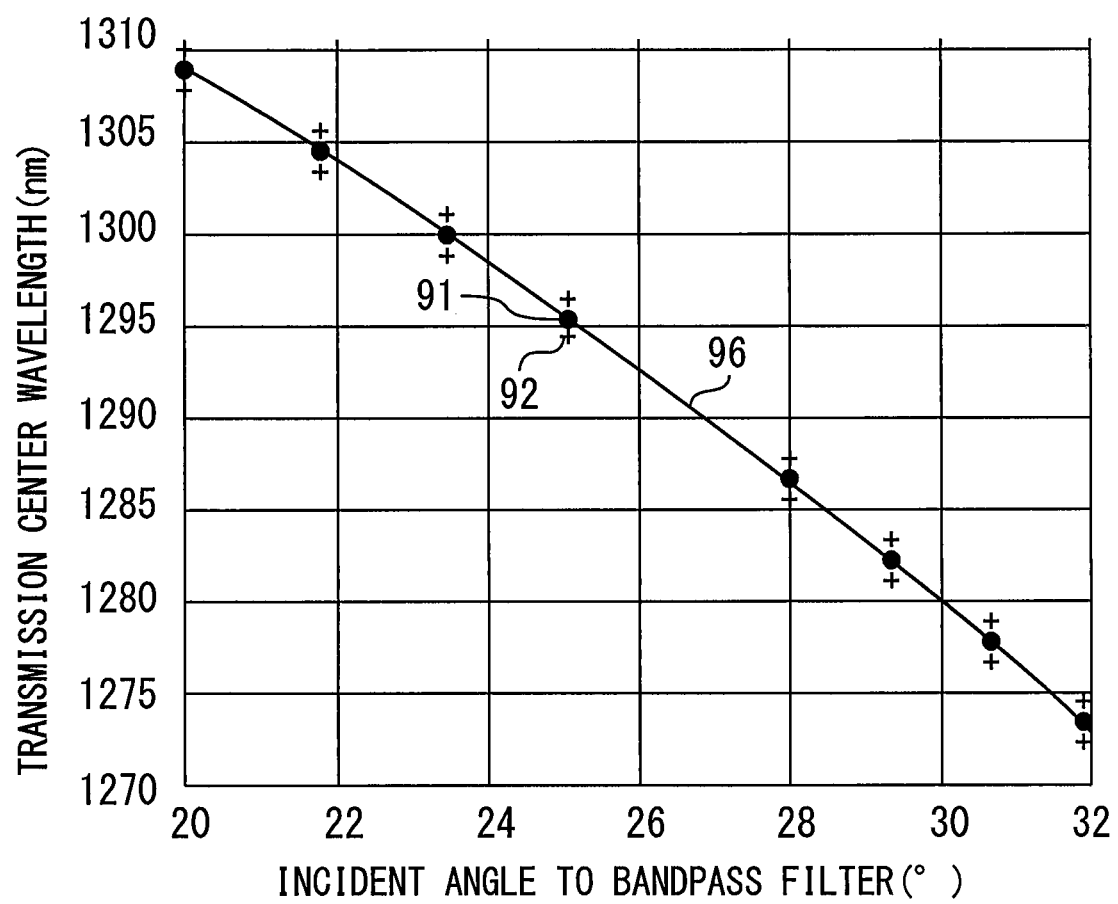
FIG. 15 is a diagram showing the relationship between the transmission center wavelength of the bandpass filter and the wavelength of the LAN-WDM standard when the reflecting surface is a curved surface.

FIG. 15 is a diagram showing the present embodiment. FIG. 15 is a diagram showing the relationship between the transmission center wavelength $\lambda_c$ of the bandpass filter 50 and the wavelength of the LAN-WDM standard when the reflecting surface 461 is a curved surface. Here, the radius of curvature of the reflecting surface 461 is equal to 80 mm.

In the present embodiment, the angles $\Delta\theta_a$ to $\Delta\theta_h$ between the respective adjacent laser beams are set so that the plural laser beams 404a to 404h are reflected by the light emitting surface 52 and the reflecting surface 461 as the curved surface to be multiplexed with one another. Therefore, the angles $\Delta\theta_a$ to $\Delta\theta_h$ between the adjacent laser beams are not constant. That is, the interval of the incident angles $\theta_N$ of light of eight wavelengths to the bandpass filter 50 is not constant. Therefore, the wavelength array of the LAN-WDM standard is arranged nonlinearly with respect to the incident angle $\theta_N$ to the bandpass filter 50.

At this time, the nonlinearity of the wavelength array of the LAN-WDM standard with respect to the incident angle $\theta_N$ and the nonlinearity of the transmission center wavelength $\lambda_c$ to the incident angle $\theta_N$ cancel each other. That is, the difference between the wavelength array of the LAN-WDM standard and the transmission center wavelength $\lambda_c$ of the bandpass filter 50 can be made smaller as compared with the case where the reflecting surface 461 is a flat surface. Therefore, as shown in FIG. 15, the transmission center wavelength $\lambda_c$ of the bandpass filter 50 and the center wavelength of the LAN-WDM standard are enabled to substantially coincide with each other at eight wavelengths.

In the present embodiment, the laser array 430 is manufactured at equi-wavelength intervals so as to aim at the center wavelengths of the LAN-WDM standard. Even when this laser array 430 is used, it is possible to transmit the plural laser beams 404a to 404h in the vicinity of the center of the transmission band of the bandpass filter 50. Therefore, high light output can be obtained.

Furthermore, in the present embodiment, since the difference between the wavelength array of the LAN-WDM standard and the transmission center wavelength $\lambda_c$ of the bandpass filter 50 can be reduced, many lasers can be mounted on the wavelength-multiplexed light transmission module 400.

The nonlinearity of the wavelength array of the LAN-WDM standard with respect to the incident angle $\theta_N$ is more remarkable as the radius of curvature of the reflecting surface 461 is smaller. In the present embodiment, the radius of curvature of the reflecting surface 461 is equal to 80 mm. Generally, warping may occur in the mirror due to the difference in coefficient of linear expansion between the dielectric multilayer film and the glass material. The radius of curvature of the mirror formed by depositing the dielectric multilayer film on the glass material is larger than 80 mm, and an actual measured value of around 600 mm has been obtained. Therefore, the radius of curvature which is inevitably obtained by the difference in coefficient of linear expansion is equal to about 600 mm. Accordingly, the radius of curvature of the reflecting surface 461 does not decrease to 80 mm unless a mirror 460 having a small radius of curvature is intentionally manufactured.

As described above, when the radius of curvature is equal to 80 mm, the transmission center wavelength $\lambda_c$ and the center wavelength of the LAN-WDM standard can be made substantially coincident with each other. When the radius of curvature decreases to be smaller than 80 mm, the difference between the transmission center wavelength $\lambda_c$ and the center wavelength of the LAN-WDM standard may increase. Furthermore, when the radius of curvature is equal to 600 mm or more, the reflecting surface 461 can be regarded as a substantially flat surface. At this time, a remarkable effect based on warping of the reflecting surface 461 cannot be expected. That is, the radius of curvature of the reflecting surface 461 is desirably equal to 80 mm or more and less than 600 mm. At this time, warping of the reflecting surface 461 works effectively.

Figure 16:
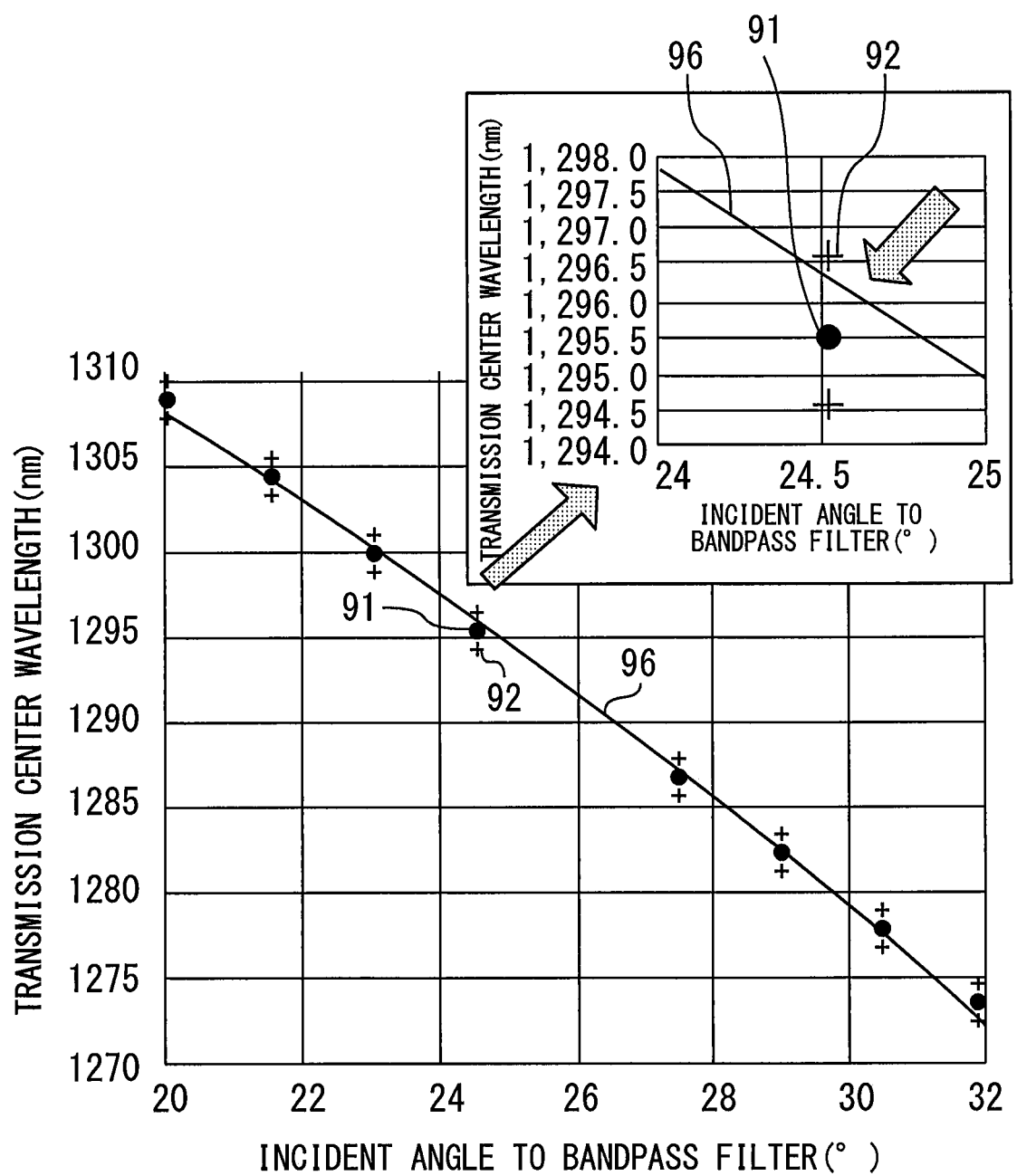
FIG. 16 is a diagram showing the relationship between the transmission center wavelength of the bandpass filter and the wavelength of the LAN-WDM standard when the reflecting surface is warped to the opposite side to a light emitting surface.

FIG. 16 is a diagram showing the relationship between the transmission center wavelength $\lambda_c$ of the bandpass filter 50 and the wavelength of the LAN-WDM standard when the reflecting surface 461 is warped to the opposite side to the light emitting surface 52. In FIG. 16, the radius of curvature of the reflecting surface 461 is equal to 600 mm. At this time, it is found that the transmission center wavelength $\lambda_c$ falls into a range between the upper limit and the lower limit of the LAN-WDM standard at all wavelengths.

Figure 17:
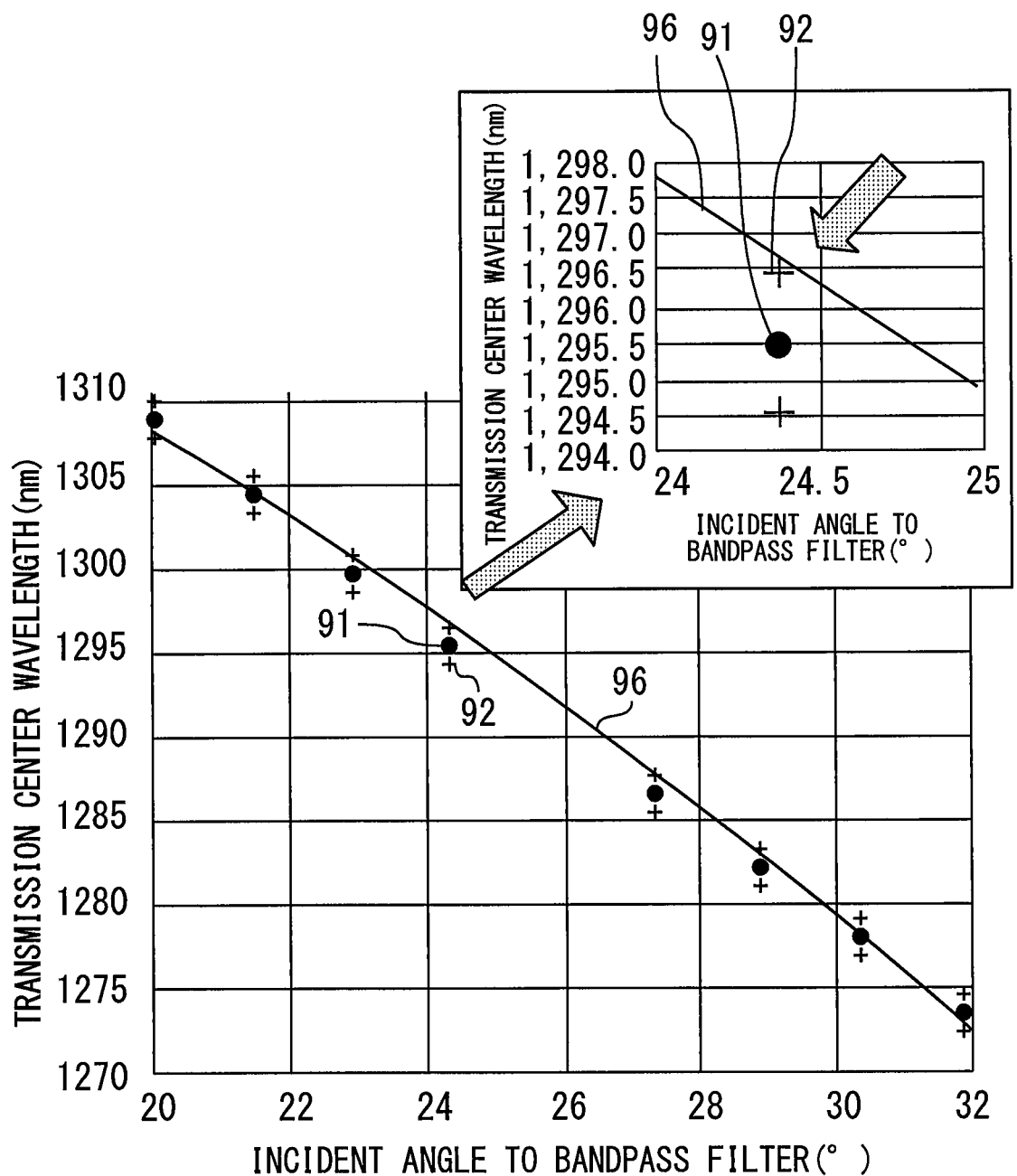
FIG. 17 is a diagram showing the relationship between the transmission center wavelength of the bandpass filter and the wavelength of the LAN-WDM standard when the reflecting surface is warped to the light emitting surface.

FIG. 17 is a diagram showing the relationship between the transmission center wavelength $\lambda_c$ of the bandpass filter 50 and the wavelength of the LAN-WDM standard when the reflecting surface 461 is warped to the light emitting surface 52. FIG. 17 shows the relationship between the transmission center wavelength $\lambda_c$ and the wavelength of the LAN-WDM standard when the mirror 460 is inverted from the state of FIG. 16. In this case, the difference between the transmission center wavelength $\lambda_c$ and the wavelength of the LAN-WDM standard increases due to the warping of the reflecting surface 461. That is, the warping of the reflecting surface 461 adversely affects, and there may occur a case where a wavelength at which the transmission center wavelength $\lambda_c$ does not fall into the range between the upper limit and the lower limit of the LAN-WDM standard.

As described above, the amount of warping which inevitably occurs in the structure of mirror is small. Therefore, the variation of the amount of warping does not significantly affect the characteristics of the wavelength-multiplexed light transmission module 400. However, as shown in FIG. 17, in a case where the warping direction is reversed, there is a tendency that the influence of deviation from the transmission center wavelength $\lambda_c$ of the wavelength of the LAN-WDM standard becomes great even when the radius of curvature of the warping is equal to about 600 mm.

Therefore, it is important that the reflecting surface 461 is warped to the opposite side to the light emitting surface 52. In this case, as compared with the case where the reflecting surface 461 is warped to the light emitting surface 52, it is possible to obtain the effect of reducing the deviation between the wavelength array of the LAN-WDM standard and the transmission center wavelength $\lambda_c$. This effect can be obtained even when the radius of curvature of the reflecting surface 461 is outside the range from 80 mm or more to less than 600 mm.

Note that the technical features described in the above embodiments may be combined as appropriate.

REFERENCE SIGNS LIST

100,300,400 wavelength-multiplexed light transmission module, 4,404a-404h laser beam, 12,412a-412h laser, 3,403 lens, $\lambda_c, \lambda_0$ transmission center wavelength, 50,350 bandpass filter, 61,361,461 reflecting surface, 60,360,460 mirror, $\theta_N, \theta_1, \theta_2, \theta_3, \theta_4$ incident angle, 52,352 light emitting surface, $\theta_t$ inclination angle, $\Delta\theta, \Delta\theta_a$-$\Delta\theta_h, \theta_a, \theta_b$ angle, 32 emitting end face, 2 waveguide, 30,430 laser array, WG interval, f focal length, MFD mode field diameter, $\lambda_N$ oscillation wavelength, n effective refractive index, 319 mounting flat surface, 353,363 mounting surface

The invention claimed is:

1. A wavelength-multiplexed light transmission module comprising:
   a plurality of lasers that respectively emit a plurality of laser beams having different wavelengths from one another;
   a lens to which the plurality of laser beams are incident, the lens radially emitting the plurality of laser beams,
   a bandpass filter that is provided in a light emitting direction of the lens and has a transmission center wavelength which is shorter as an incident angle is larger, and
   a mirror that is provided to be inclined with respect to the bandpass filter in a light emitting direction of the bandpass filter and has a reflecting surface for reflecting the plurality of laser beams,
   wherein the plurality of laser beams are incident to the bandpass filter such that the incident angle of a laser beam is larger as the laser beam has a shorter wavelength, whereby the plurality of laser beams are transmitted through the bandpass filter, and
   an inclination angle of the reflecting surface with respect to a light emitting surface of the bandpass filter is provided such that the plurality of laser beams transmitted through the bandpass filter are reflected by the light emitting surface and the reflecting surface to be multiplexed with one another.

2. The wavelength-multiplexed light transmission module according to claim 1, wherein the lens emits the plurality of laser beams so that an angle between mutually adjacent laser beams is constant.

3. The wavelength-multiplexed light transmission module according to claim 1, wherein the reflecting surface is a curved surface warped to an opposite side to the light emitting surface.

4. The wavelength-multiplexed light transmission module according to claim 3, wherein a radius of curvature of the curved surface is 80 mm or more and less than 600 mm.

5. The wavelength-multiplexed light transmission module according to claim 1, wherein the inclination angle is equal to one half of an angle between mutually adjacent laser beams among the plurality of laser beams emitted from the lens.

6. The wavelength-multiplexed light transmission module according to claim 1, wherein only one lens and only one bandpass filter are provided as the lens and the bandpass filter, respectively.

7. The wavelength-multiplexed light transmission module according to claim 1, comprising a laser array including the plurality of lasers and a plurality of waveguides that are provided for the plurality of lasers respectively and guide the plurality of laser beams to an emitting end face,
wherein the laser array emits the plurality of laser beams from the emitting end face,
the emitting end face is arranged at a focal position of the lens, and
an interval WG between adjacent waveguides on the emitting end face, a focal length f of the lens, the inclination angle $\theta_t$, and a mode field diameter MFD of the plurality of waveguides satisfy

[Math. 1]

$$|WG - f \times \tan(2 \times \theta_t)| \leq MFD/10.$$

8. The wavelength-multiplexed light transmission module according to claim 1, comprising a laser array including the plurality of lasers and a plurality of waveguides that are provided for the plurality of lasers respectively and guide the plurality of laser beams to an emitting end face,
wherein the laser array emits the plurality of laser beams from the emitting end face,
the plurality of waveguides are arranged at equal intervals on the emitting end face, and
the emitting end face is arranged at a focal position of the lens.

9. The wavelength-multiplexed light transmission module according to claim 1, wherein the incident angle of each of the plurality of laser beams is equal to 3° or more.

10. The wavelength-multiplexed light transmission module according to claim 1, wherein with respect to each of the plurality of lasers, an oscillation wavelength $\lambda_N$ of a laser beam emitted from a laser, the transmission center wavelength $\lambda_0$ when the incident angle is equal to 0°, an effective refractive index n of the bandpass filter, and the incident angle $\theta_N$ of the laser beam satisfy $$\lambda_N = \lambda_0 \cdot \sqrt{1 - \left(\frac{\sin\theta_N}{n}\right)^2} \pm 0.5 \text{ nm.} \qquad \text{[Math. 2]}$$

11. The wavelength-multiplexed light transmission module according to claim 1, wherein with respect to each of the plurality of lasers, an oscillation wavelength of a laser beam emitted from a laser is set in conformity with the transmission center wavelength corresponding to the incident angle of the laser beam.

12. The wavelength-multiplexed light transmission module according to claim 1, comprising a laser array including the plurality of lasers and a plurality of waveguides that are provided for the plurality of lasers respectively and guide the plurality of laser beams to an emitting end face,
wherein the bandpass filter and the mirror are mounted on a mounting flat surface, and an intersection angle $\theta_b$ between the mounting flat surface and the reflecting surface,
an intersection angle $\theta_a$ between the mounting flat surface and the light emitting surface,
a number N of the plurality of lasers,
a focal length f of the lens, and
a mode field diameter MFD of the plurality of waveguides satisfy $$|\theta_a + \theta_b - 180°| \leq \left|\frac{1}{2(N-1)}\tan^{-1}\frac{MFD}{2f}\right|. \qquad \text{[Math. 3]}$$

13. A method for manufacturing the wavelength-multiplexed light transmission module according to claim 12, comprising a step of polishing a mounting surface of the mirror and a mounting surface of the bandpass filter in a state where the reflecting surface and the light emitting surface are in contact with each other.

14. The wavelength-multiplexed light transmission module according to claim 1, wherein the bandpass filter and the mirror are mounted on a mounting flat surface, and an intersection angle between the mounting flat surface and the reflecting surface and an intersection angle between the mounting flat surface and the light emitting surface are supplementary to each other.

* * * * *